United States Patent
Funaki et al.

[11] Patent Number: 5,894,164
[45] Date of Patent: Apr. 13, 1999

[54] HIGH VOLTAGE SEMICONDUCTOR DEVICE

[75] Inventors: Hideyuki Funaki, Tokyo; Akio Nakagawa, Yokohama; Norio Yasuhara, Kawasaki; Yoshinori Terazaki, Tokyo, all of Japan

[73] Assignee: Kabushiki Kaisha Toshiba, Kawasaki, Japan

[21] Appl. No.: 08/927,691

[22] Filed: Sep. 11, 1997

[30] Foreign Application Priority Data

Sep. 17, 1996 [JP] Japan ............................ 8-245319

[51] Int. Cl.$^6$ ................................................ H01L 29/72
[52] U.S. Cl. ........................ 257/654; 257/378; 257/382; 257/496; 257/579
[58] Field of Search .............................. 257/378, 382, 257/496, 579, 654

[56] References Cited

U.S. PATENT DOCUMENTS 5,760,424  6/1998  Oppermann ..................... 257/378

OTHER PUBLICATIONS

D.R. Disney, et al., "A Trench–Gate LIGBT Structure and Two LMCT Structures in SOI Substrates", Proc. of 6th ISPSD, May 31, 1994, pp. 405–410.

*Primary Examiner*—Edward Wojciechowicz
*Attorney, Agent, or Firm*—Oblon, Spivak, McClelland, Maier & Neustadt, P.C.

[57] ABSTRACT

A lateral IGBT has a n-source layer and a p-contact layer both in contact with a source electrode. The source layer has a trunk adjacent to a channel region under a gate electrode, and a plurality of branches extending from its trunk to the source electrode to be in contact with the source electrode. The contact layer has a trunk in contact with the source electrode, and a plurality of branches extending from its trunk to the source layer trunk. The source layer branches and the contact layer branches have shapes complementary with each other and are alternately arranged. The source layer trunk has a width La in an X direction (channel direction), which satisfies a condition, $0.5\ \mu m < La < 2\ \mu m$.

20 Claims, 5 Drawing Sheets

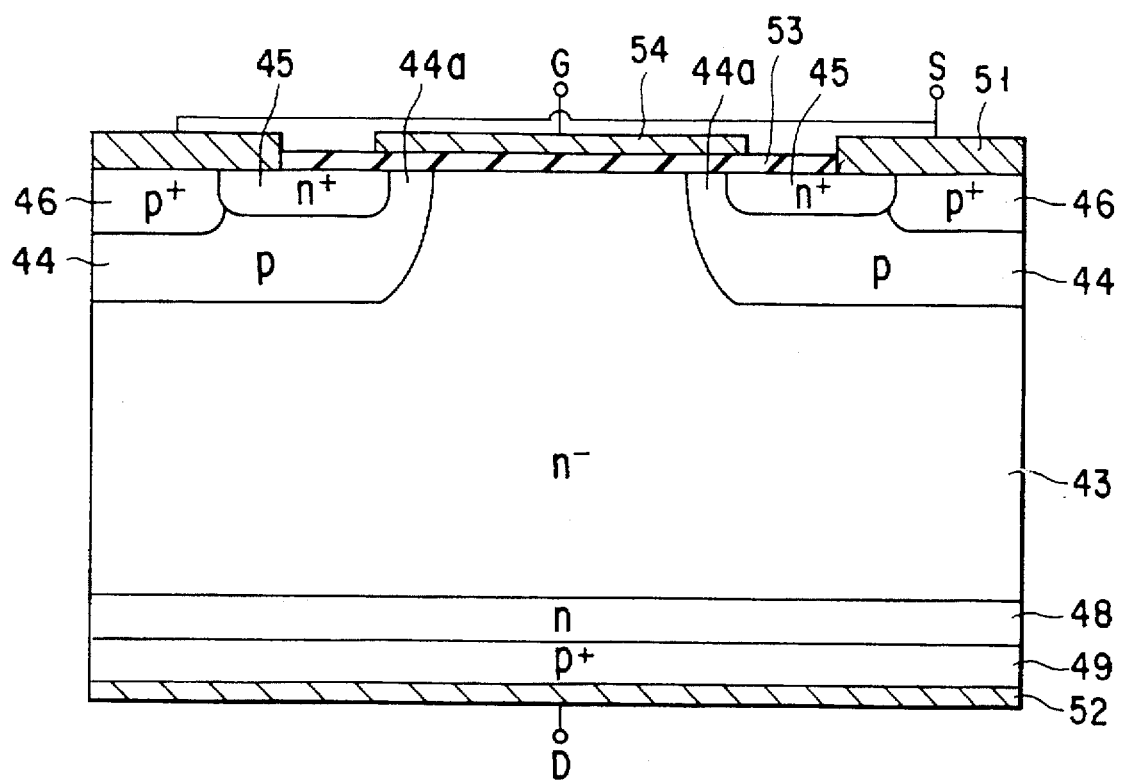
F I G. 12
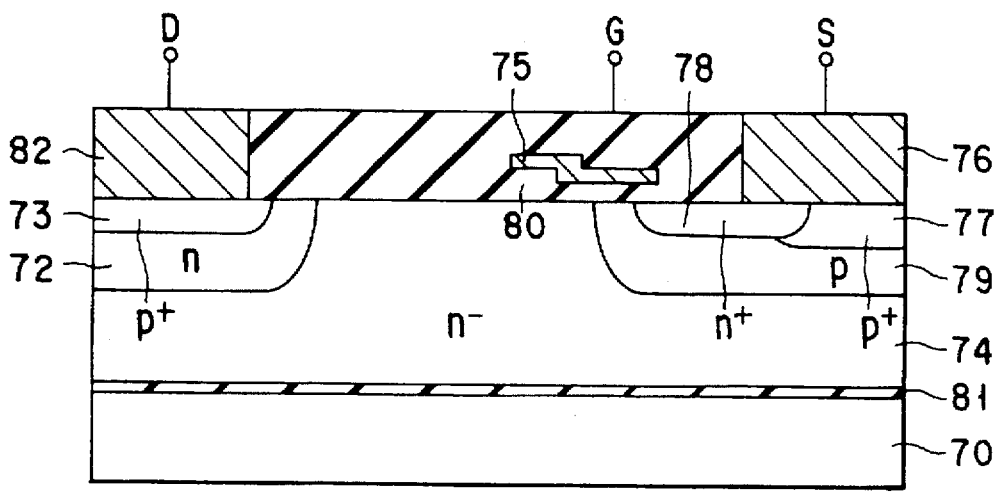
F I G. 13

HIGH VOLTAGE SEMICONDUCTOR DEVICE

BACKGROUND OF THE INVENTION

The present invention relates to a high voltage semiconductor device, and particularly to a high voltage semiconductor device including an insulated gate bipolar transistor (IGBT).

In recent years, research and development have been eagerly conducted on a technique for forming both a high voltage semiconductor device and a peripheral driving circuit for driving the device on the same substrate. The technique allows the whole system to be compact or highly integrated and to decrease its manufacturing cost.

There is a known method of fabricating a semiconductor device, using a silicon layer adhered to a substrate through an insulating film, i.e., silicon on an insulator (SOI), in order to achieve a high breakdown voltage. With this technique, the insulating film shears a loaded voltage, thereby improving its breakdown voltage. Further, with this technique, a high voltage semiconductor device and a low voltage peripheral driving circuit can be arranged on a substrate and separated by a trench. In other words, the high voltage semiconductor device and the peripheral driving circuit can be arranged on the same substrate, thereby allowing the whole system to be compact and inexpensive.

High voltage semiconductor devices should perform a high current output and a low loss output. In light of the high current output, it is preferable for the devices to be of the bipolar type. However, in light of controllability, since peripheral driving circuits perform a voltage output, it is preferable for the devices to be of the MOS type. IGBTs are known as -one type of high voltage semiconductor device, which satisfy the above two points. FIG. 13 is a cross-sectional view showing a structure of a conventional lateral IGBT.

This device has a silicon substrate 70 having a surface covered with an oxide film 81. An n-base layer 74 having a high resistance is formed on the oxide film 81, and a p-base layer 79 is formed in a surface of the n-base layer 74.

In a surface of the p-base layer 79, an n-source layer 78 having a low resistance, and a p-contact layer 77 having a low resistance and arranged in contact with the n-source layer 78, are formed. A source electrode 76 is arranged in contact with the n-source layer 78 and the p-contact layer 77.

A gate electrode 76 is arranged through a gate insulating film 80 on the p-base layer 79 between the n-source layer 78 and the n-base layer 74. A gate electrode 75 is provided with a stepped portion, as shown in FIG. 13, such that the electrode 75 functions as a field plate.

An n-buffer layer 72 is formed in the surface of the n-base layer 74, and separated from the p-base 5 layer 79 by a certain distance. A p-drain layer 73 having a low resistance is formed in a surface of the n-buffer layer 72. A drain electrode 82 is arranged in contact with the p-drain layer 73.

When the lateral IGBT described above is turned on, the gate electrode 75 is supplied with a gate voltage, which is positive to the source electrode 76 and is higher than a threshold voltage. When such a gate voltage is applied to the gate electrode 75, an n-channel is formed in the surface of the p-base layer 79 under the gate insulating film 80, and electrons are injected from the n-source layer 78 into the n-base layer 74 through the n-channel.

With the injection of electrons into the n-base layer 74, holes are injected from the p-drain layer 73 into the n-base layer 74 through the n-buffer layer 72. As a result, electrons and holes are accumulated in the n-base layer 74 and cause conductivity modulation, thereby decreasing the resistance of the n-base layer 74. It follows that the main electric current, i.e., drain current, comes to flow, while ON-resistance is kept low, and the device is turned on.

On the other hand, when the device is turned on, a gate electrode 75 is supplied with a gate voltage less than the threshold voltage. When such a gate voltage is applied to the gate electrode 75, the n-channel in the surface of the p-base layer 79 disappears, and electrons stop being injected from the n-source layer 78 into the n-base layer 74. Holes remaining in the n-source layer 78 are exhausted through the p-base layer 79 and the p-contact layer 77 to the source electrode 76. As a result, the main electric current becomes zero, and the device is turned off.

However, the above described IGBT has the following problems.

In an ON-state, a difference is brought about between a voltage drop caused by a hole current laterally flowing in the p-base layer 79 and a voltage drop caused by an electron current laterally flowing in the n-source layer 78. Due to this voltage difference, a p-n junction formed by the p-base layer 79 and n-source layer 78 or by the p-contact layer 77 and n-source layer 78 is forward-biased. When the forward bias becomes larger than the built-in voltage of the p-n junction, a parasitic transistor is turned on. In this case, a latch-up occurs and makes it impossible to turn off the device by a gate voltage for causing the main current to be zero. Further, such a lateral IGBT formed on an SOI substrate entails a problem in that it is apt to break down when driven with no load, i.e., its short-circuit withstand capability is low.

BRIEF SUMMARY OF THE INVENTION

As described above, the conventional lateral IGBTs formed on an SOI substrate exhibit a low performance as regards their short-circuit withstand capability and latch-up withstand capability The present invention has been made in light of these problems of the conventional devices, and its object is to improve the short-circuit withstand capability and the latch-up withstand capability of a high voltage semiconductor device having an IGBT structure.

According to a first aspect of the present invention, there is provided a high voltage semiconductor device, comprising a base layer of a first conductivity type having a high resistance;

a base layer of a second conductivity type formed in a first surface of the base layer of the first conductivity type;

a source layer of the first conductivity type having a low resistance and formed in a surface of the base layer of the second conductivity type;

a contact layer of the second conductivity type having a low resistance and formed in the surface of the base layer of the second conductivity type;

a source electrode arranged in contact with the source layer of the first conductivity type and the contact layer of the second conductivity type;

a gate electrode arranged through a gate insulating film on a channel region of the base layer of the second conductivity type between the base layer of the first conductivity type and the source layer of the first conductivity type, a channel being selectively formed by the gate electrode in the channel region for allowing an electric current to flow in a first direction;

a drain layer of the second conductivity type having a low resistance and arranged on the base layer of the first conductivity type;

a drain electrode arranged in contact with the drain layer of the second conductivity type, wherein the source layer has a source layer trunk adjacent to the channel region and extending in a second direction substantially perpendicular to the first direction, and a plurality of source layer branches extending from the source layer trunk to the source electrode to be in contact with the source electrode, the contact layer has a contact layer trunk opposite the source layer trunk and extending in the second direction to be in contact with the source electrode, and a plurality of contact layer branches extending from the contact layer trunk to the source layer trunk, the source layer branches and the contact layer branches have shapes complementary with each other and are alternately arranged, and the source layer trunk has a width La between the channel region and the source layer branches in the first direction such that the width La satisfies a condition, La<2 µm.

According to a second aspect of the present invention, there is provided a high voltage semiconductor device, comprising:

a first semiconductor layer of a first conductivity type;

a second semiconductor layer of a second conductivity type connected to the first semiconductor layer, for allowing second conductivity type charge carriers to be injected into the first semiconductor layer to cause a conductivity modulation to occur therein;

a third semiconductor layer of the first conductivity type connected to the first semiconductor layer, for allowing first conductivity type charge carriers to be injected into the first semiconductor layer;

a fourth semiconductor layer of the second conductivity type connected to the first semiconductor layer, for allowing the second conductivity type charge carriers contained in the first semiconductor layer to move externally out of the first semiconductor layer;

a MOS transistor for selectively connecting the first semiconductor layer and the third semiconductor layer by forming a channel for allowing an electric current to flow in a first direction;

a first main electrode connected to the second semiconductor layer; and a second main electrode connected to the third and fourth semiconductor layers, wherein each of the third and fourth semiconductor layers has a trunk extending in a second direction substantially perpendicular to the first direction, and a plurality of branches extending from its trunk to the other trunk, the branches of the third and fourth semiconductor layers have shapes complementary with each other and are alternately arranged, the third semiconductor layer is in contact with the second main electrode through its branches, and the trunk of the third semiconductor layer has a width La in the first direction such that the width La satisfies a condition, La<2 µm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a cross-sectional view along a line XII—XII in FIG. 11; and

FIG. 13 is a cross-sectional view showing a conventional lateral IGBT.

DETAILED DESCRIPTION OF THE INVENTION

Figure 1:
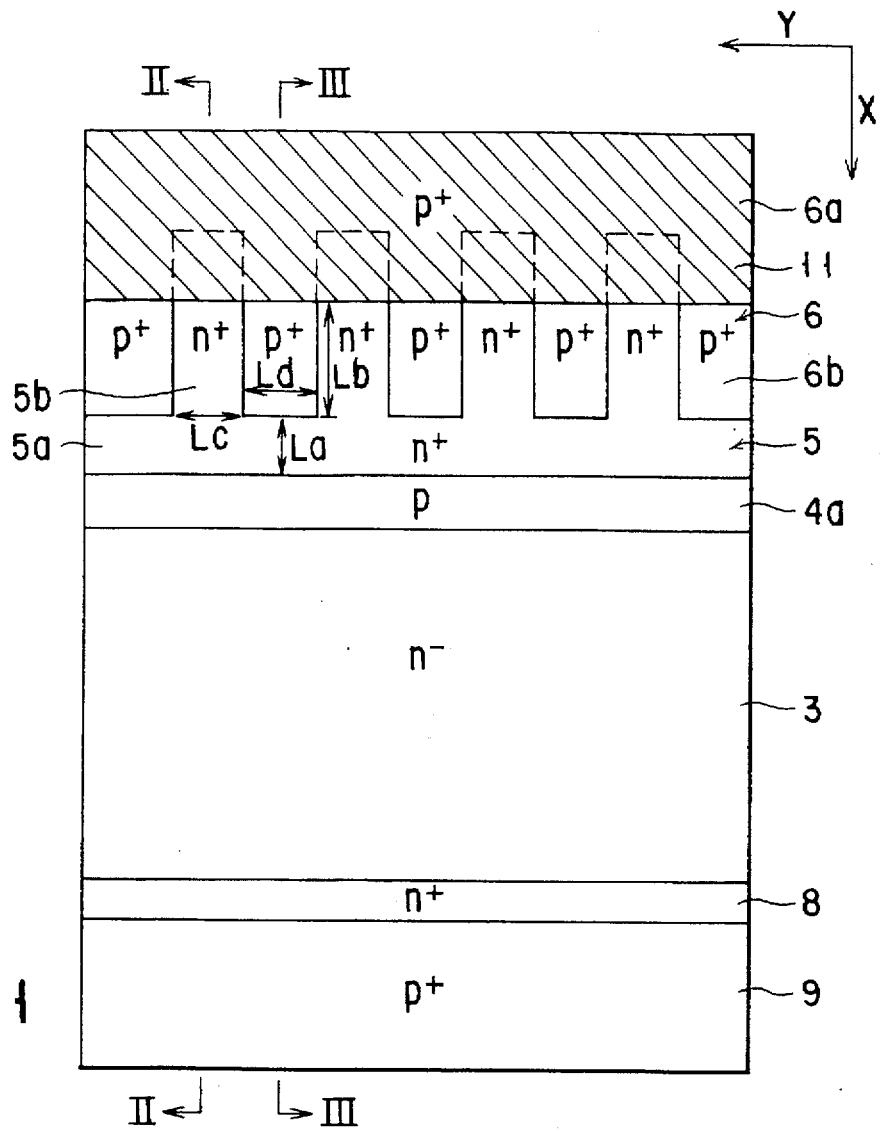
FIG. 1 is a plan view showing a lateral IGBT according to an embodiment of the present invention.
Figure 2:
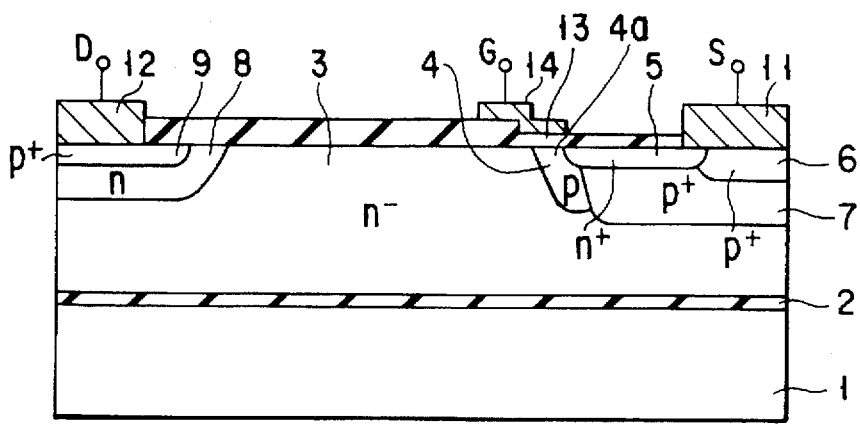
FIG. 2 is a cross-sectional view along a line II—II in FIG. 1.
Figure 3:
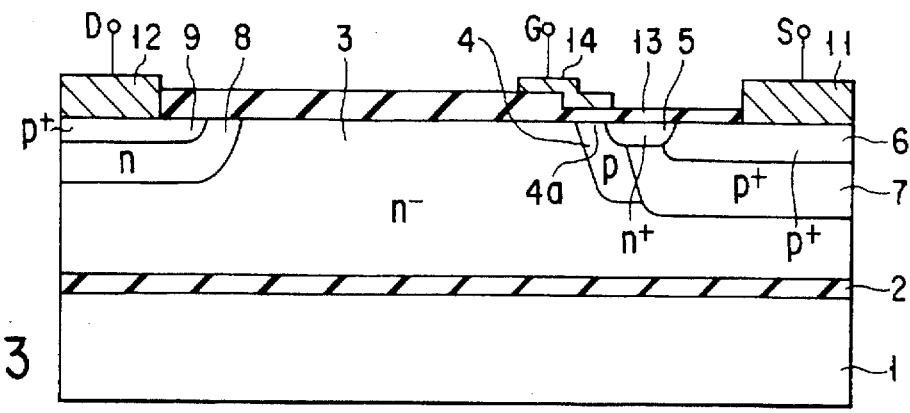
FIG. 3 is a cross-sectional view along a line III—III in FIG. 1.

FIG. 1 is a plan view showing a lateral IGBT according to an embodiment of the present invention. FIGS. 2 and 3 are cross-sectional views along lines II—II and III—III in FIG. 1.

This device has an n-base layer 3 formed of a silicon layer having a high resistance, which is arranged on a silicon substrate 1 through a silicon oxide film 2. An SOI substrate is constituted by the silicon substrate 1, the silicon oxide film 2, and the n-base layer 3.

Preferably, the silicon oxide film 2 has a thickness of from 0.5 µm to 3.5 µm, depending on the breakdown voltage of the device, and the n-base layer 3 has a thickness of about 10 µm. The n-base layer 3 preferably has an impurity concentration per unit area of from $1 \times 10^{12}$ cm$^{-2}$ to $3.0 \times 10^{12}$ cm$^{-2}$.

A p-base layer 4 is formed in a surface of the n-base layer 3. In a surface of the p-base layer 4, an n-source layer 5 having a low resistance, and a first p-contact layer 6 having a low resistance are formed. A source electrode 11 is arranged in contact with the n-source layer 5 and the first p-contact layer 6. The contact structure among the n-source layer 5, the first p-contact layer 6, and the source electrode 11 will be described later.

Preferably, the p-base layer 4 has a depth of from 4 μm to 6 μm and a dose of from $3.0 \times 10^{13}$ cm$^{-2}$ to $6.0 \times 10^{13}$ cm$^{-2}$.

A second p-contact layer 7 having a low resistance is formed in the p-base layer 4 to be in contact with the n-source layer 5 and the first p-contact layer 6. The second p-contact layer 7 having a low resistance is used for lowering a voltage drop Vh caused by a hole current laterally flowing in the p-base layer 4 and flowing into source electrode 11 through the first p-contact layer 6.

The second p-contact layer 7 preferably has a dose of from $1.0 \times 10^{14}$ cm$^{-2}$ to $2.0 \times 10^{15}$ cm$^{-2}$.

An n-buffer layer 8 is formed in the surface of the n-base layer 3, and separated from the interface between the n-base layer 3 and the p-base layer 4 by a certain distance. A p-drain layer 9 having a low resistance is formed in a surface of the n-buffer layer 8. A drain electrode 12 is arranged in contact with the p-drain layer 9.

A surface portion of the p-base layer 4 interposed between the n-base layer 3 and the n-source layer 5 is used as a channel region 4a for selectively connecting the n-base layer 3 and the n-source layer 5. A gate electrode 14 is arranged through a gate insulating film 13 on the channel region 4a. When a certain voltage is applied to the gate electrode 14, a channel is formed in the channel region 4a for allowing an electric current to flow therein along an X direction shown in FIG. 1. The gate electrode 14 is provided with a stepped portion, as shown in FIG. 1, such that the electrode 14 functions as a field plate.

The contact structure among the n-source layer 5, the first p-contact layer 6, and the source electrode 11 is constructed as follows. With this contact structure, a latch-up is effectively prevented from occurring in this embodiment.

In order to prevent a latch-up, it may be possible to form the n-source layer 5 in a stripe shape in parallel to the p-base layer 4, thereby decreasing the width of the n-source layer 5 to shorten the traveling distance of carriers. However, in this case, the contact between the n-source layer 5 and the source electrode 11 may be deteriorated.

In contrast, according to this embodiment, as shown in FIG. 1, the n-source layer 5 and the first p-contact layer 6 are formed as combs complementarily engaging with each other. More specifically, the n-source layer 5 has a source layer trunk 5a adjacent to the channel region 4a and extending in a Y direction perpendicular to the X direction, and a plurality of source layer branches 5b extending from the source layer trunk 5a to the source electrode 11. The source layer 5 is in contact with the source electrode 11 only through the source layer branches 5b. On the other hand, the first p-contact layer 6 has a contact layer trunk 6a opposite the source layer trunk 5a and extending in the Y direction to be in contact with the source electrode 11, and a plurality of contact layer branches 6b extending from the contact layer trunk 6a to the source layer trunk 5a. The contact layer branches 6b are partly in contact with source electrode 11 from their root sides. The source layer branches 5b and the contact layer branches 6b have shapes complementary with each other and are alternately arranged.

In this contact structure, a voltage drop Ve caused by an electron current laterally flowing in the n-source layer 5, which is used for allowing the electron current to flow, becomes large. On the other hand, a voltage drop Vh caused by a hole current laterally flowing in the p-base layer 4 becomes small, since the second p-contact layer 7 having a low resistance is arranged in addition to the p-base layer 4 in a region which is used for allowing the hole current to flow. As a result, their difference, i.e., Vh−Ve, becomes small, thereby preventing a parasitic transistor from being turned on by a forward bias applied onto a p-n junction.

In other words, a latch-up is prevented from occurring due to the activated parasitic transistor, so that the device can be turned off for certain by causing the main electric current to become zero with a gate voltage. It follows that a lateral IGBT having a high latch-up withstand capability can be realized.

Figure 4:
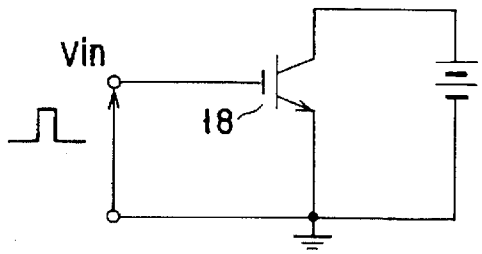
FIG. 4 is a view showing a circuit used for evaluating the lateral IGBT shown in FIG. 1.

Using a circuit shown in FIG. 4, a gate voltage formed of a pulse voltage Vin having a frequency of 7 Hz and a pulse width of 5 μs was applied to the gate electrode of a lateral IGBT 18 according to this embodiment, and the amplitude of the pulse voltage Vin was increased until the device broke down. Such an experiment was conducted on a plurality of samples of a lateral IGBT 18 having different widths La of the trunk 5a of the n-source layer 5 in the X direction, i.e., the channel length direction, which were 13 μm, 7 μm, 3 μm, 2 μm, 1 μm, and 0.5 μm, respectively. The width La of the trunk 5a is, in other words, the width of the source layer 5 in the X direction, at a portion between two adjacent branches 5a.

In the experiment, two kinds of SOI substrates were used. One of them, which is indicated with black dots in FIG. 5, was designed such that the silicon oxide film 2 and the n-base layer 3 had thicknesses of 0.5 μm and 10 μm, respectively. The other, which is indicated with white dots in FIG. 5, was designed such that the silicon oxide film 2 and the n-base layer 3 had thicknesses of 2 μm and 10 μm, respectively. The p-base layer 4 commonly had a depth of 4 μm and a dose of $4.0 \times 10^{13}$ cm$^{-2}$.

Figure 5:
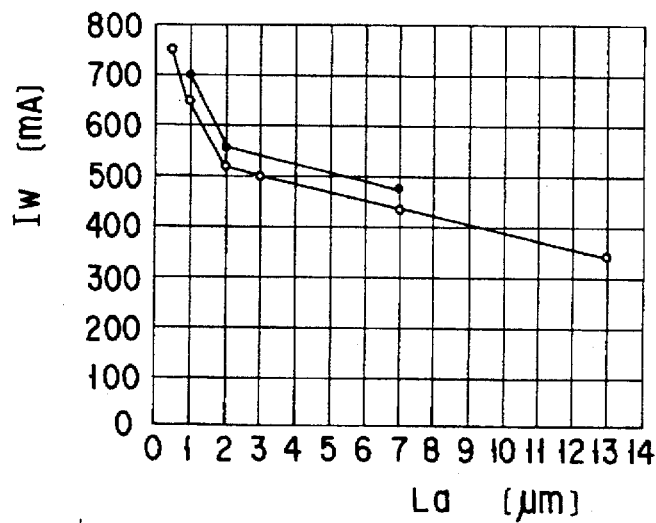
FIG. 5 is a graph showing a relation between the width of the trunk of an n-source layer and the short-circuit withstand current of a lateral IGBT.

FIG. 5 is a graph obtained by the experiment, showing a relation between the width La of the trunk 5a of the n-source layer 5 and the short-circuit withstand current Iw, i.e., the short-circuit withstand capability, of a lateral IGBT. As shown in FIG. 5, it has been found that the short-circuit withstand current Iw, i.e., the short-circuit withstand capability, greatly increases where the width La of the trunk 5a of the n-source layer 5 is less than 2 μm. Such a phenomenon has never been found before.

On the other hand, in light of the limit of photolithography techniques currently available, it is preferable for the width La to be greater than 0.5 μm. For the reason described above, the width La of the trunk 5a of the n-source layer 5 is preferably set to satisfy a condition, 0.5 μm<La<2 μm. It should be noted, however, that the width La may be further decreased in the future with improvement in precision of photolithography techniques.

Further, as a result of other experiments, it has been found that parameters La, Lb, Lc, and Ld are preferably set to satisfy the following relations. Note that, in this embodiment, La stands for the width of the source layer trunk 5a in the X direction; Lb for the length of each source layer branch 5b from the source layer trunk 5a to the contact between the source layer 5 and the source electrode 11; Lc for the width of each source layer branch 5b in the Y direction; and Ld for the distance between adjacent source layer branches 5b in the Y direction, i.e., the width of each contact layer branch 6.

Figure 6:
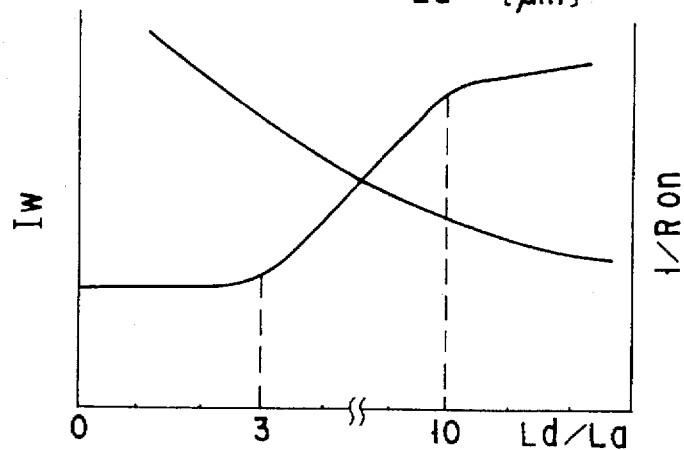
FIG. 6 is a graph showing a relation between a parameter Ld/La and the short-circuit withstand current.

First, as shown in FIG. 6, it has been found that the short-circuit withstand current Iw, i.e., the short-circuit withstand capability, greatly increases with an increase in a value Ld/La, where conditions, La<2 μm, and Lc+Ld=6 μm, are fixed. However, where Ld/La becomes too large, the increasing rate of the short-circuit withstand capability is lowered while the ON-resistance Ron of the IGBT is rather increased, thereby causing a trade-off. For this reason, Ld/La is preferably set to satisfy a condition, $3<Ld/La<10$, in light of a range within which the increasing rate of the short-circuit withstand current Iw is high. This condition should be satisfied where Lc+Ld is not 6 μm.

The width Lc of each source layer branch 5b and the width Ld of each contact layer branch 6b are preferably set to satisfy a condition, $5<Ld/Lc<10$. Where Ld/Lc has a larger value out of this range, the voltage drop in the n-source layer 5 becomes too large, thereby increasing the ON-resistance Ron. On the other hand, where Ld/Lc has a smaller value out of this range, it is difficult to sufficiently obtain the effect of the lateral voltage drop.

The width Lc of each source layer branch 5b and the length Lb of the non-contact portion of each source layer branch 5b are preferably set to satisfy a condition, $0.5<Lb/Lc<2$. Where Lb/Lc has a larger value out of this range, the device may end up in asymmetry due to mask shifting, thereby causing the electric current to flow less uniformly. On the other hand, where Lb/Lc has a smaller value out of this range, it is difficult to sufficiently obtain the effect of the voltage drop in the source layer branches 5b.

Further, it has been found that the short-circuit withstand capability correlates to the thickness of the gate insulating film. Namely, where the drain voltage is kept constant, the saturation current becomes lower with a decrease in the thickness of the gate insulating film. Accordingly, by setting the thickness of the gate insulating to be small, it is possible to allow the device to hardly break down. This is because, in this case, the main electric current flowing through the device due to a short-circuit is decreased, even if the drain voltage is high. More specifically, for example, where the thickness of the gate insulating film is set to be not more than 30 nm, it is possible to prevent the device from breaking down, even if a gate voltage VG of 5V and a drain voltage of 300V are used.

Figure 7:
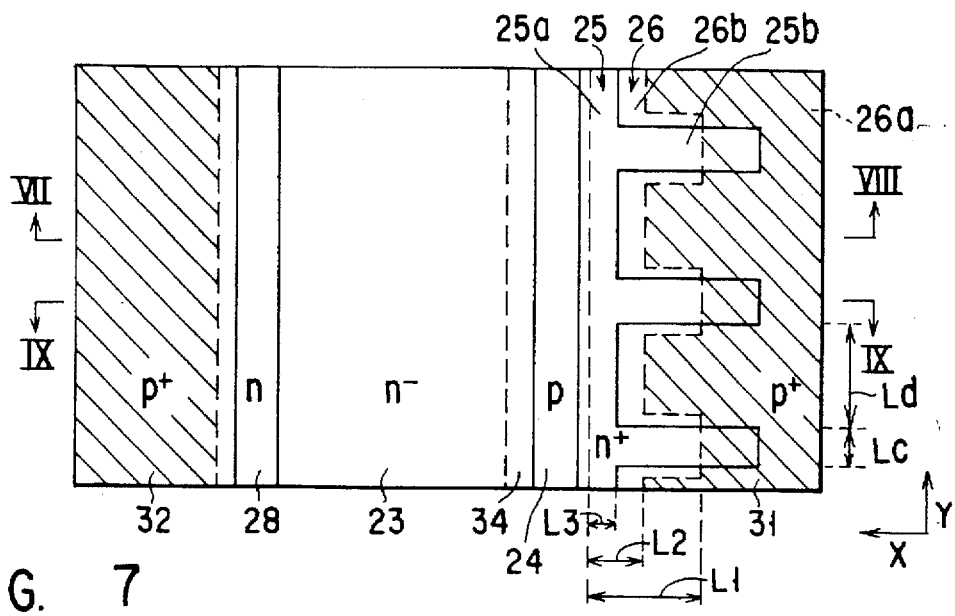
FIG. 7 is a plan view showing a lateral IGBT according to another embodiment of the present invention.
Figure 8:
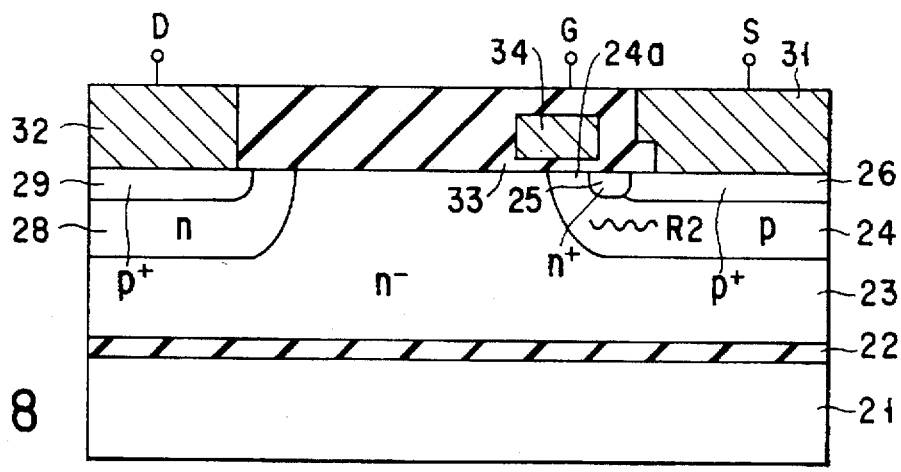
FIG. 8 is a cross-sectional view along a line VIII—VIII in FIG. 7.
Figure 9:
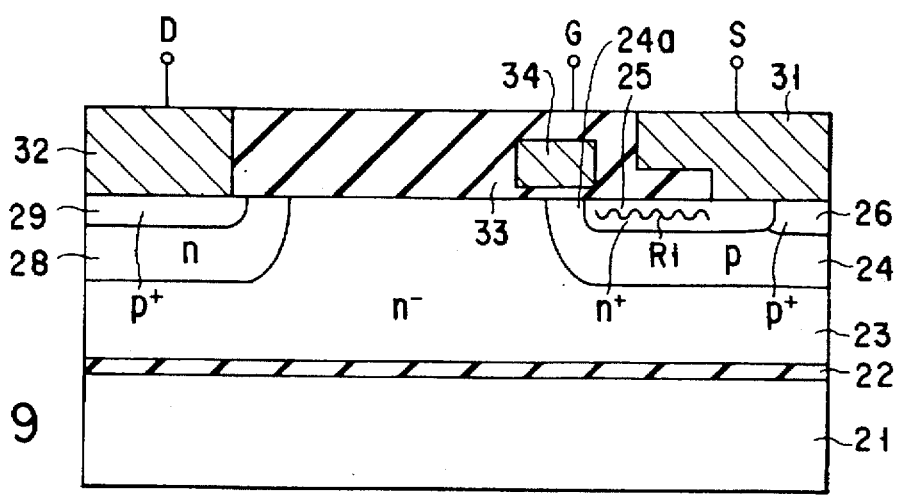
FIG. 9 is a cross-sectional view along a line IX—IX in FIG. 7.

FIG. 7 is a plan view showing a lateral IGBT according to another embodiment of the present invention. FIGS. 8 and 9 are cross-sectional views along lines VIII—VIII and IX—IX in FIG. 7.

In FIG. 7, the boundaries on the surface of the device between n-type semiconductor regions and p-type semiconductor regions are shown with solid lines. The contours of contact portions between semiconductor regions and electrodes and that of a gate electrode are shown with broken lines. Further, the contact regions of the electrode are shown with diagonal hatching.

This device has an n-base layer 23 formed of a silicon layer having a high resistance, which is arranged on a silicon substrate 21 through a silicon oxide film 22. An SOI substrate is constituted by the silicon substrate 21, the silicon oxide film 22, and the n-base layer 23. A p-base layer 24 is formed in a surface of the n-base layer 23. In a surface of the p-base layer 24, an n-source layer 25 having a low resistance, and a p-contact layer 26 having a low resistance are formed. A source electrode 31 is arranged in contact with the n-source layer 25 and the p-contact layer 26.

An n-buffer layer 28 is formed in the surface of the n-base layer 23, and separated from the interface between the n-base layer 23 and the p-base layer 24 by -a certain distance. A p-drain layer 29 having a low resistance is formed in a surface of the n-buffer layer 28. A drain electrode 32 is arranged in contact with the p-drain layer 29.

A surface portion of the p-base layer 24 interposed between the n-base layer 23 and the n-source layer 25 is used as a channel region 24a for selectively connecting the n-base layer 23 and the n-source layer 25. A gate electrode 34 is arranged through a gate insulating film 33 on the channel region 24a. When a certain voltage is applied to the gate electrode 34, a channel is formed in the channel region 24a for allowing an electric current to flow therein along an X direction shown in FIG. 7. The gate electrode 34 is embedded in an insulating film 33 covering the substrate surface between the source electrode 31 and the drain electrode 32.

The n-source layer 25 and the p-contact layer 26 are formed as combs complementarily engaging with each other, as in the embodiment shown in FIGS. 1 to 3. More specifically, the n-source layer 25 has a source layer trunk 25a and a plurality of source layer branches 25b, while the p-contact layer 26 has a contact layer trunk 26a and a plurality of contact layer branches 26b. The source layer branches 25b and the contact layer branches 26b have shapes complementary with each other and are alternately arranged.

Preferable values of the thickness and the impurity concentration of each layer and preferable relations of parameters La, Lb, Lc, and Ld are the same as those in the embodiment shown in FIGS. 1 to 3. Note that, in this embodiment, La stands for the width of the source layer trunk 25a in the X direction; Lb for the length of each source layer branch 25b from the source layer trunk 25a to the contact between the source layer 25 and the source electrode 31; Lc for the width of each source layer branch 25b in the Y direction; and Ld for the distance between adjacent source layer branches 25b in the Y direction, i.e., the width of each contact layer branch 26b.

Further, in this embodiment, the source electrode 31 is formed as a comb to satisfy the following condition. Namely, a length L1 is larger than a length L2, where L1 stands for the length from the contact between the n-source layer 25 and the source electrode 31 to the gate electrode 34, and L2 for the length from the contact between the p-contact layer 26 and the source electrode 31 to the gate electrode 34. This contact structure is adopted for the following reason.

As described above, it is provided that Ve stands for a voltage drop caused by an electron current laterally flowing in the n-source layer 25, and Vh for a voltage drop caused by a hole current laterally flowing in the p-base layer 24. When a value, Vh–Ve, becomes larger than the built-in voltage of the p-n junction constituted by the p-base layer 24 and the n-source layer 25, the p-n junction is forward-biased, thereby causing a latch-up of the device.

The lateral resistances R1 and R2 of the n-source layer 25 and the p-base layer 24 become larger with an increase in the lengths L1 and L2, respectively Accordingly, the value, Vh–Ve, can be made small by setting the length L1 at larger than the length L2. As a result, it is possible to prevent a latch-up due to a forward bias applied onto the p-n junction constituted by the p-base layer 24 and the n-source layer 25.

Figure 10:
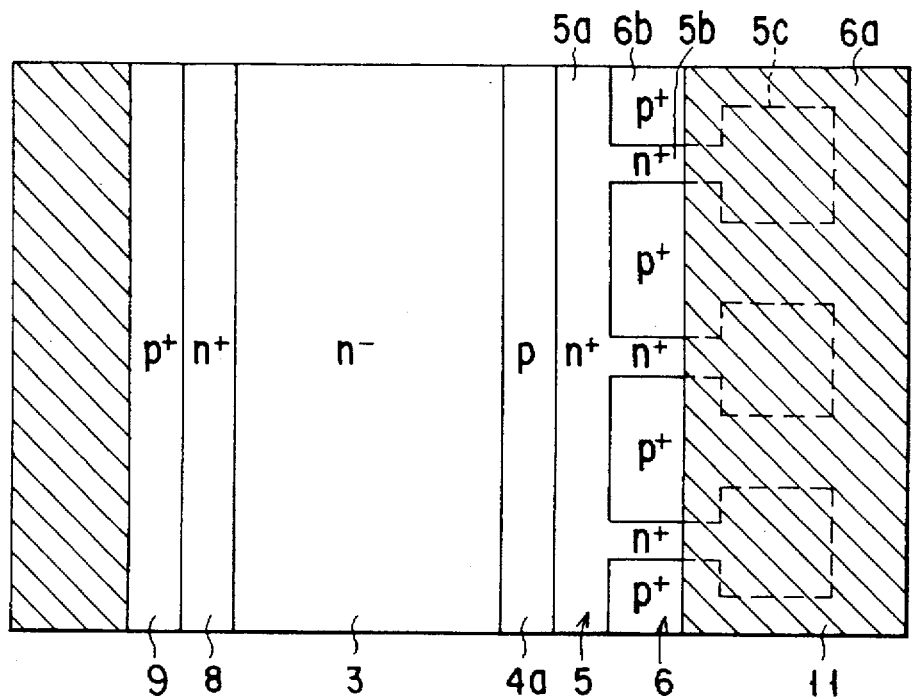
FIG. 10 is a plan view showing a lateral IGBT according to still another embodiment of the present invention.

FIG. 10 is a plan view showing a lateral IGBT according to still another embodiment of the present invention. This embodiment is shown with reference numbers the same as those in the embodiment shown in FIGS. 1 to 3, and its detailed explanation is omitted.

This embodiment is characterized in that expanding portions 5c having a resistance as low as the source layer branches 5b are respectively formed at the distal ends of the source layer branches 5b to ensure the contact surface area relative to the source electrode 11. With this arrangement, it is possible to lower the contact resistance between the source layer 5 and the source electrode 11 while maintaining a short-circuit withstand capability as high as the embodiment shown in FIGS. 1 to 3.

Figure 11:
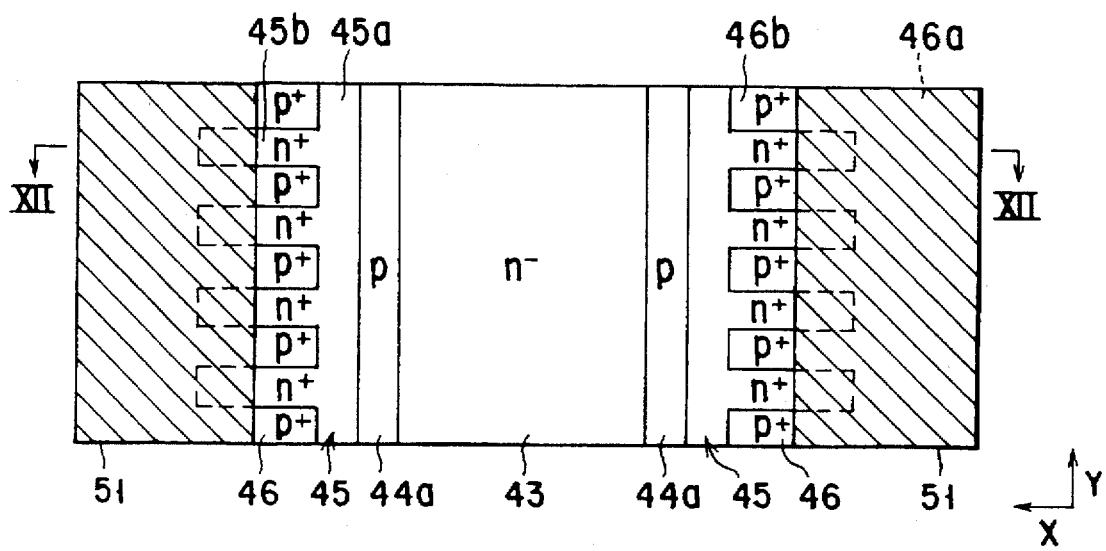
FIG. 11 is a plan view showing a vertical IGBT according to still another embodiment of the present invention.

FIG. 11 is a plan view showing a vertical IGBT according to still another embodiment of the present invention. FIG. 12 is cross-sectional view along a line XII—XII in FIG. 12.

This device has an n-base layer 43 formed of a silicon substrate having a high resistance. A plurality of band-like p-base layers 44 are symmetrically formed in a front surface of the n-base layer 43. In a surface of each p-base layer 44, an n-source layer 45 having a low resistance, and a p-contact layer 46 having a low resistance are formed. A source electrode 51 is arranged in contact with the n-source layer 45 and the p-contact layer 46. As a result, in the embodiment, a plurality of p-base layers 44, n-source layers 45, p-contact layers 46, and source electrodes 51 are arranged in a repeated pattern to form essentially symmetric pairs.

On the back surface, a p-drain layer 49 having a low resistance is formed through an n-buffer layer 48. A drain electrode 52 is arranged in contact with the p-drain layer 49.

A surface portion of the p-base layer 44 interposed between the n-base layer 43 and the n-source layer 45 is used as a channel region 44a for selectively connecting the n-base layer 43 and the n-source layer 45. As a result, a plurality of channel regions 44a are also repeatedly arranged to form essentially symmetric pairs. A common gate electrode 54 is arranged through a gate insulating film 53 on the pair of channel regions 44a. When a certain voltage is applied to the gate electrode 54, a channel is formed in each of the channel regions 44a for allowing an electric current to flow therein along an X direction shown in FIG. 11.

The n-source layer 45 and the p-contact layer 46 are formed as combs complementarily engaging with each other, as in the embodiment shown in FIGS. 1 to 3. More specifically, the n-source layer 45 has a source layer trunk 45a and a plurality of source layer branches 45b, while the p-contact layer 46 has a contact layer trunk 46a and a plurality of contact layer branches 46b. The source layer branches 45b and the contact layer branches 46b have shapes complementary with each other and are alternately arranged.

Preferable values of the thickness and the impurity concentration of each layer and preferable relations of parameters La, Lb, Lc, and Ld are the same as those in the embodiment shown in FIGS. 1 to 3. Note that, in this embodiment, La stands for the width of the source layer trunk 45a in the X direction; Lb for the length of each source layer branch 45b from the source layer trunk 45a to the contact between the source layer 45 and the source electrode 51; Lc for the width of each source layer branch 45b in the Y direction; and Ld for the distance between adjacent source layer branches 45b in the Y direction, i.e., the width of each contact layer branch 46b.

The present invention is not limited to the above described embodiment. For example, although an n-channel IGRT has been described in each embodiment, a p-channel IGBT can be similarly constituted only by reversing the conductivity type of each layer.

As described above, in the present invention, an n- (or p-) source layer and a p- (or n-) contact layer, which are in contact with a source electrode, are formed as combs complementarily engaging with each other, while the width of the trunk of the source layer is specified. With this structure, it is possible to provide a high voltage semiconductor device which has an improved short-circuit withstand capability and an improved latch-up withstand capability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A high voltage semiconductor device, comprising:

a base layer of a first conductivity type having a high resistance;

a base layer of a second conductivity type formed in a first surface of said base layer of the first conductivity type;

a source layer of the first conductivity type having a low resistance and formed in a surface of said base layer of the second conductivity type;

a contact layer of the second conductivity type having a low resistance and formed in the surface of said base layer of the second conductivity type;

a source electrode arranged in contact with said source layer of the first conductivity type and said contact layer of the second conductivity type;

a gate electrode arranged through a gate insulating film on a channel region of said base layer of the second conductivity type between said base layer of the first conductivity type and said source layer of the first conductivity type, a channel being selectively formed by said gate electrode in said channel region for allowing an electric current to flow in a first direction;

a drain layer of the second conductivity type having a low resistance and arranged on said base layer of the first conductivity type;

a drain electrode arranged in contact with said drain layer of the second conductivity type, wherein said source layer has a source layer trunk adjacent to said channel region and extending in a second direction substantially perpendicular to said first direction, and a plurality of source layer branches extending from said source layer trunk to said source electrode to be in contact with said source electrode, said contact layer has a contact layer trunk opposite said source layer trunk and extending in said second direction to be in contact with said source electrode, and a plurality of contact layer branches extending from said contact layer trunk to said source layer trunk, said source layer branches and said contact layer branches have shapes complementary with each other and are alternately arranged, and said source layer trunk has a width La between said channel region and said source layer branches in said first direction such that said width La satisfies a condition, La<2 µm.

2. The device according to claim 1, wherein said width La satisfies a condition, 0.5 µm<La.

3. The device according to claim 1, wherein adjacent two of said source layer branches are separated by a distance Ld in said second direction, and said distance Ld and said width La satisfy a condition, 3<Ld/La<10.

4. The device according to claim 3, wherein each of said source layer branches has a width Lc in said second direction, and said width Lc and said distance Ld satisfy a condition, 5<Ld/Lc<10.

5. The device according to claim 4, wherein each of said source layer branches has a length Lb from said source layer trunk to a contact between said source layer and said source electrode, and said length Lb and said width Lc satisfy a condition, 0.5<Lb/Lc<2.

6. The device according to claim 1, wherein said contact layer has an extending portion extending under said source layer branches.

7. The device according to claim 1, wherein each of said source layer branches is provided with an expanding portion at its distal end for ensuring a contact surface area relative to said source electrode.

8. The device according to claim 1, wherein, in said first direction, a distance from said gate electrode to a contact between said source layer and said source electrode is larger than a distance from said gate electrode to a contact between said contact layer and said source electrode.

9. The device according to claim 1, wherein said drain layer is formed in said first surface of said base layer of the first conductivity type.

10. The device according to claim 9, wherein said base layer of the first conductivity type is arranged on an insulating layer.

11. The device according to claim 1, wherein said drain layer is arranged on a second surface of said base layer of the first conductivity type, which is situated opposite said first surface.

12. The device according to claim 11, wherein each of said base layer of the second conductivity type, said source layer, said contact layer, said source electrode, and said channel region comprises first and second portions arranged substantially in symmetry.

13. The device according to claim 1, wherein said first and second conductivity types are n- and p-types, respectively.

14. A high voltage semiconductor device, comprising:
   a first semiconductor layer of a first conductivity type;
   a second semiconductor layer of a second conductivity type connected to said first semiconductor layer, for allowing second conductivity type charge carriers to be injected into said first semiconductor layer to cause a conductivity modulation to occur therein;
   a third semiconductor layer of said first conductivity type connected to said first semiconductor layer, for allowing first conductivity type charge carriers to be injected into said first semiconductor layer;
   a fourth semiconductor layer of said second conductivity type connected to said first semiconductor layer, for allowing said second conductivity type charge carriers contained in said first semiconductor layer to move externally out of said first semiconductor layer;
   a MOS transistor for selectively connecting said first semiconductor layer and said third semiconductor layer by forming a channel for allowing an electric current to flow in a first direction;
   a first main electrode connected to said second semiconductor layer; and
   a second main electrode connected to said third and fourth semiconductor layers,
   wherein each of said third and fourth semiconductor layers has a trunk extending in a second direction substantially perpendicular to said first direction, and a plurality of branches extending from its trunk to the other trunk, said branches of said third and fourth semiconductor layers have shapes complementary with each other and are alternately arranged, said third semiconductor layer is in contact with said second main electrode through its branches, and said trunk of said third semiconductor layer has a width La in said first direction such that said width La satisfies a condition, La<2 µm.

15. The device according to claim 14, wherein said third semiconductor layer connected to said first semiconductor layer via said fourth semiconductor layer such that said channel is formed through said fourth semiconductor layer.

16. The device according to claim 14, wherein said trunk and branches of said third and fourth semiconductor layers comprise semiconductor regions each having a low resistance.

17. The device according to claim 14, wherein said width La satisfies a condition, 0.5 µm<La.

18. The device according to claim 14, wherein adjacent two of said branches of said third semiconductor layer are separated by a distance Ld in said second direction, and said distance Ld and said width La satisfy a condition, 3<Ld/La<10.

19. The device according to claim 18, wherein each of said branches of said third semiconductor layer has a width Lc in said second direction, and said width Lc and said distance Ld satisfy a condition, 5<Ld/Lc<10.

20. The device according to claim 19, wherein each of said branches of said third semiconductor layer has a length Lb from said trunk of said third semiconductor layer to a contact between said third semiconductor semiconductor layer and said second main electrode, and said length Lb and said width Lc satisfy a condition, 0.5<Lb/Lc<2.

* * * * *